(12) United States Patent
Makino et al.

(10) Patent No.: US 6,343,038 B1
(45) Date of Patent: Jan. 29, 2002

(54) SEMICONDUCTOR MEMORY DEVICE OF SHARED SENSE AMPLIFIER SYSTEM

(75) Inventors: Eiichi Makino; Yohji Watanabe; Daisuke Kato, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/653,264

(22) Filed: Aug. 31, 2000

(30) Foreign Application Priority Data

Sep. 3, 1999 (JP) .......................................... 11-250516

(51) Int. Cl.⁷ ................................................. G11C 7/00
(52) U.S. Cl. ........................................ 365/203; 365/194
(58) Field of Search ................................ 365/203, 202, 365/194

(56) References Cited

U.S. PATENT DOCUMENTS

| 5,153,853 A | * 10/1992 | Eby et al. | ................ 365/185 |
| 5,499,211 A | 3/1996 | Kirihata et al. | ............ 365/203 |
| 5,673,231 A | 9/1997 | Furutani | ................ 365/203 |

FOREIGN PATENT DOCUMENTS

| JP | 5-54693 | 3/1993 | |
| JP | 406052679 | * 2/1994 | ......... G11C/11/401 |
| JP | 07-320498 | 12/1995 | |
| JP | 10-199298 | 7/1998 | |

OTHER PUBLICATIONS

Betty Prince, "Semiconductor Memories", 1983, 2nd Edition, pp. 394–395.*

* cited by examiner

Primary Examiner—David Nelms
Assistant Examiner—M. Tran
(74) Attorney, Agent, or Firm—Finnegan, Henderson, Farabow, Garrett, & Dunner, L.L.P.

(57) ABSTRACT

In a semiconductor memory device including a bit line precharge/equalizing circuit, the control system of the bit line precharge/equalizing circuit is changed in the normal operation mode and in the test mode. In the test mode, the bit line precharge/equalizing circuit is temporarily turned ON when an internal activation signal becomes non-active and then the bit line precharge/equalizing circuit is turned OFF after the potentials of paired bit lines are completely equalized.

20 Claims, 12 Drawing Sheets

SEMICONDUCTOR MEMORY DEVICE OF SHARED SENSE AMPLIFIER SYSTEM

CROSS-REFERENCE TO RELATED APPLICATIONS

This application is based upon and claims the benefit of priority from the prior Japanese Patent Application No. 11-250516, filed Sep. 3, 1999, the entire contents of which are incorporated herein by reference.

BACKGROUND OF THE INVENTION

This invention relates to a semiconductor memory device. More particularly, the invention relates to the technique of screening the bit lines provided in a semiconductor memory device having a shared sense amplifier system, some of the bit lines connected to one side of a sense amplifier and conducting a leakage current and the others of the bit lines connected to the other side of the sense amplifier. The invention also relates to the technique of reducing a standby current generated from the leakage current flowing in the bit lines of such a semiconductor memory device.

In recent years, occurrence of a bit line leakage current becomes significant with an increase in the integration density of a semiconductor memory device as is represented by a leakage current occurring in a short circuit between a bit line and a word line. The short circuit between the bit line and the word line which is the main cause of the bit line leakage current causes the following problem if a dynamic RAM (DRAM) is taken as an example. That is, at the standby time, paired bit lines are kept at a preset bit line precharged potential (VBL). Generally, the precharge potential is set to half the high-level potential of the bit line. At this time, the potential of the word line is set at a low level. Therefore, if a short circuit portion occurs between the bit line and the word line, a leakage current will continuously flow from the bit line which is set at the preset precharge potential (VBL) to the word line which is set at the low level potential (for example, ground potential). As a result, the potential of the bit line which is short-circuited to the word line is lowered. The amount of a lowering in the bit line potential depends on a resistance between the short-circuited bit line and word line and the conductance of a precharge current limiting element connected to the bit line.

In this case, a special problem occurs in a case where a semiconductor memory device using a shared sense amplifier system in which the sense amplifier is commonly used for adjacent bit lines and which recently becomes dominant is used. In the semiconductor memory device using the shared sense amplifier system, a bit line disposed adjacent to and on the opposite side of a defective bit line which is short-circuited with the word line with the sense amplifier disposed therebetween is also influenced by the short circuit and the operation margin thereof is reduced, but since the amount of the reduction is small in comparison with the bit line which is short-circuited, it becomes extremely difficult to detect the bit line by effecting the screening operation. As a result, the semiconductor memory device passes a test in the wafer state, is subjected to the post process without replacing the defective bit line by a redundancy circuit and is detected defective in the product test effected after it is assembled into a package, and in the worst case, there is a possibility that it may be shipped as a product.

The product having the bit line leakage current is one of the main causes which increase the number of defective products in the market since a resistance between the bit line and the word line which are short-circuited with each other is lowered by an influence due to the deterioration with time or the like. Therefore, a method for effectively screening the bit line having the bit line leakage current is indispensable.

FIG. 1 shows the conventional semiconductor memory device and shows one example of a representative shared sense amplifier and bit line precharge/equalizing circuit. The circuit includes an N-channel sense amplifier 10, P-channel sense amplifier 11, bit line precharge/equalizing circuits 20, 21 and bit switches 40, 41.

The bit line precharge/equalizing circuit 20 is connected to paired bit lines BLL, /BLL to precharge the paired bit lines BLL, /BLL and equalize the potentials thereof so as to set the potentials thereof to a bit line precharge potential VBL. One end of the current path of a cell transistor TN50 is connected to the bit line BLL and the gate thereof is connected to a word line WLL. A cell capacitor C10 is connected between the other end of the current path of the cell transistor TN50 and the ground node. The cell transistor TN50 and the cell capacitor C10 are combined to form a memory cell.

The bit line precharge/equalizing circuit 21 is connected to paired bit lines BLR, /BLR to precharge the paired bit lines BLR, /BLR and equalize the potentials thereof so as to set the potentials thereof to the bit line precharge potential VBL. One end of the current path of a cell transistor TN51 is connected to the bit line BLR and the gate thereof is connected to a word line WLR1. A cell capacitor C11 is connected between the other end of the current path of the cell transistor TN51 and the ground node. The cell transistor TN51 and the cell capacitor C11 are combined to form a memory cell. Further, one end of the current path of a cell transistor TN52 is connected to the bit line /BLR and the gate thereof is connected to a word line WLR2. A cell capacitor C12 is connected between the other end of the current path of the cell transistor TN52 and the ground node. The cell transistor TN52 and the cell capacitor C12 are combined to form a memory cell.

The N-channel sense amplifier 10 and P-channel sense amplifier 11 are arranged adjacent to each other. The bit switch 40 is disposed between the bit line precharge/equalizing circuit 20 and the sense amplifiers 10, 11 and the bit switch 41 is disposed between the bit line precharge/equalizing circuit 21 and the sense amplifiers 10, 11. Further, the current paths of column select transistors TN30, TN31 are connected between the sense amplifiers 10, 11 and paired data lines DL, /DL. A column select signal CSL is supplied to the gates of the column select transistors TN30, TN31.

The N-channel sense amplifier 10 is constructed by N-channel MOS transistors TN11, TN12 and the operation thereof is controlled by an N-channel sense amplifier control signal φSN. The P-channel sense amplifier 11 is constructed by P-channel MOS transistors TP11, TP12 and the operation thereof is controlled by a P-channel sense amplifier control signal φSP.

The bit line precharge/equalizing circuit 20 is constructed by N-channel MOS transistors TN20 to TN22 and the bit line precharge/equalizing circuit 21 is constructed by N-channel MOS transistors TN23 to TN25. A precharge/equalizing circuit control signal φEQL is supplied to the gates of the MOS transistors TN20 to TN22 to precharge the paired bit lines BLL, /BLL and equalize the potentials thereof. A precharge/equalizing circuit control signal φEQR is supplied to the gates of the MOS transistors TN23 to TN25 to precharge the paired bit lines BLR, /BLR and equalize the potentials thereof.

The bit switch 40 is constructed by N-channel MOS transistors TN40, TN41 and controlled by a bit switch control signal φL. The bit switch 41 is constructed by N-channel MOS transistors TN42, TN43 and controlled by a bit switch control signal φR.

In FIG. 1, an example in which the bit line /BLR is short-circuited to the word line WLR2 is shown and it is equivalently expressed by a resistor Rshort.

FIG. 2 is a block diagram showing an equalizing signal generation circuit 50 for generating a precharge/equalizing circuit control signal φEQL/R in the circuit shown in FIG. 1 based on an equalizing/precharge circuit control signal φEQLCONTL/R. FIG. 3 shows an example of the detail construction of the equalizing signal generation circuit 50. As shown in FIG. 3, the equalizing signal generation circuit 50 is constructed by cascade-connected inverters INV30, INV31, INV32. The equalizing/precharge circuit control signal φEQLCONTL/R is supplied to the input terminal of the inverter INV30 and the precharge/equalizing circuit control signal φEQL/R is output from the output terminal of the inverter INV 32.

FIG. 4 is a timing chart showing operation waveforms in a case where the word line WLL is selected in the circuit shown in FIG. 1. When an internal activation signal /ACTIVE is set to a low level, the equalizing/precharge circuit control signal φEQLCONTL/R of the paired bit lines BLL, /BLL on the selected side is set to a high level, the precharge/equalizing circuit control signal φEQL is set to a low level, and the bit line precharge circuit 20 is set into the OFF state. Further, the control signal φR of the bit switch 41 on the non-selected side is also set to the low level to electrically separate the paired bit lines BLR, /BLR on the non-selected side from the sense amplifiers 10, 11.

Next, the word line WLL is set to the high level potential, the cell transistor TN50 is set into the ON state, and data of the cell capacitor C10 is read out to the bit line BLL. After cell data is read out to the bit line BLL, the sense amplifier activation signal φSN is set to the low level and the sense amplifier activation signal φSP is set to the high level so that the N-channel and P-channel sense amplifiers 10, 11 can be activated to amplify the readout potential.

At this time, a case wherein the word line WLR1 and the bit line /BLR are short-circuited to each other via the short-circuit resistor is considered. At the non-selected time, the equalizing/precharge circuits 20, 21 are set in the ON state and all of the bit lines BLL, /BLL, BLR, /BLR are precharged to the VBL level. Therefore, even if the potential of the bit line /BLR is lowered by the leakage current, it is difficult to correctly effect the screening operation when the short-circuit resistance is relatively high. Particularly, in the shared sense amplifier system, since the bit line /BLR having the bit line leakage current is connected to the bit line /BLL which is adjacent to the bit line with the sense amplifiers 10, 11 disposed therebetween via the bit switches 40, 41, there occurs a possibility that the bit line precharge potential VBL is lowered. If the bit line precharge potential VBL is lowered, the readout margin is reduced when "0" data is read out from the memory cell.

However, at the non-selected time, since the potential VBL is generally supplied via the bit line precharge/equalizing circuits 20, 21 after passing through a current limiting element for suppressing an increase in the standby current, a lowering in the potential level due to the bit line leakage current will be compensated for to some extent. Therefore, it becomes more difficult to detect the defective bit line.

Further, the bit line leakage current causes the standby current of the semiconductor memory device to be increased and is an important factor for lowering the manufacturing yield. Particularly, in recent years, devices are extremely strongly required for lower power consumption as represented by portable information terminals and note-book type personal computers and it is strongly required to reduce the standby current.

BRIEF SUMMARY OF THE INVENTION

Accordingly, an object of this invention is to provide a semiconductor memory device in which a bit line having a leakage current can be effectively screened.

Further, another object of this invention is to provide a semiconductor memory device in which an increase in the standby current due to a bit line leakage current can be suppressed.

Still another object of this invention is to provide a semiconductor memory device in which the manufacturing test yield can be improved and the number of defective products in the market after the shipment of the products can be suppressed.

The above object can be attained by a semiconductor memory device comprising a plurality of word lines; paired bit lines arranged to intersect the plurality of word lines; a plurality of memory cells connected to the plurality of word lines and paired bit lines; and a bit line precharge/equalizing circuit for precharging the paired bit lines and equalizing the potentials thereof; wherein the bit line precharge/equalizing circuit precharges the paired bit lines and equalizes the potentials thereof when an internal activation signal using an external signal as a trigger is set into a precharge state in a test mode, and after the delay of a preset period of time, the bit line precharge/equalizing circuit is set into an OFF state.

With the above construction, since the potentials of a bit line having the bit line leakage current and a bit line which is disposed adjacent to and on the opposite side of the bit line with the sense amplifier disposed therebetween are lowered from the precharge level to the ground level if the leakage current is caused by a short circuit between the bit line and the word line, it becomes possible to easily screen the bit line having the leakage current because the margin in the next readout cycle is reduced. Therefore, it is possible to detect the defective bit line at the test time in the wafer state and replace the defective portion by a redundancy circuit so as to improve the manufacturing yield and reduce the number of defective products in the market.

Further, the above object can be attained by a semiconductor memory device comprising a plurality of word lines; paired bit lines arranged to intersect the plurality of word lines; a plurality of memory cells connected to the plurality of word lines and paired bit lines; a bit line precharge potential generation circuit for generating a bit line precharge potential for precharging the paired bit lines and equalizing the potentials thereof; a bit line precharge/equalizing circuit for applying the bit line precharge potential generated from the bit line precharge potential generation circuit to the paired bit lines to precharge the paired bit lines and equalize the potentials thereof; and a current limiting element disposed between the bit line precharge potential generation circuit and the bit line precharge/equalizing circuit, for limiting the precharge current flowing in the paired bit lines; wherein the precharge current for the paired bit lines is controlled by increasing the conductance of the current limiting element at the active time and reducing the conductance of the current limiting element at the standby time.

With the above construction, the standby current is reduced by reducing the conductance of the current limiting element at the standby time and the sufficiently large operation margin can be attained by increasing the conductance of the current limiting element at the active time. Thus, the sufficiently large operation margin can be attained and an increase in the standby current due to the leakage current can be effectively reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 5:
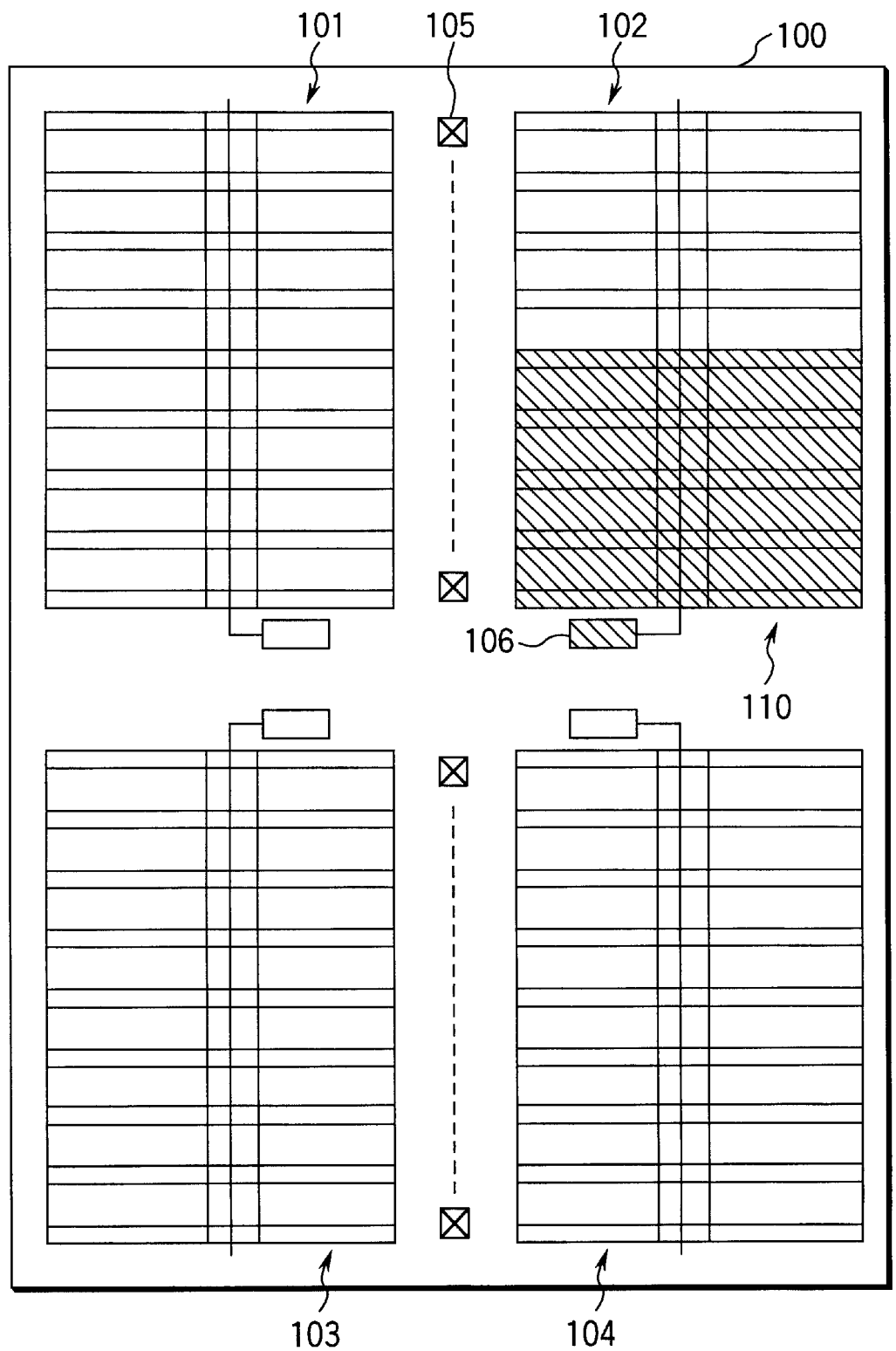
FIG. 5 is a plan view showing the pattern layout of a chip, for illustrating a semiconductor memory device according to a first embodiment of this invention.
Figure 6:
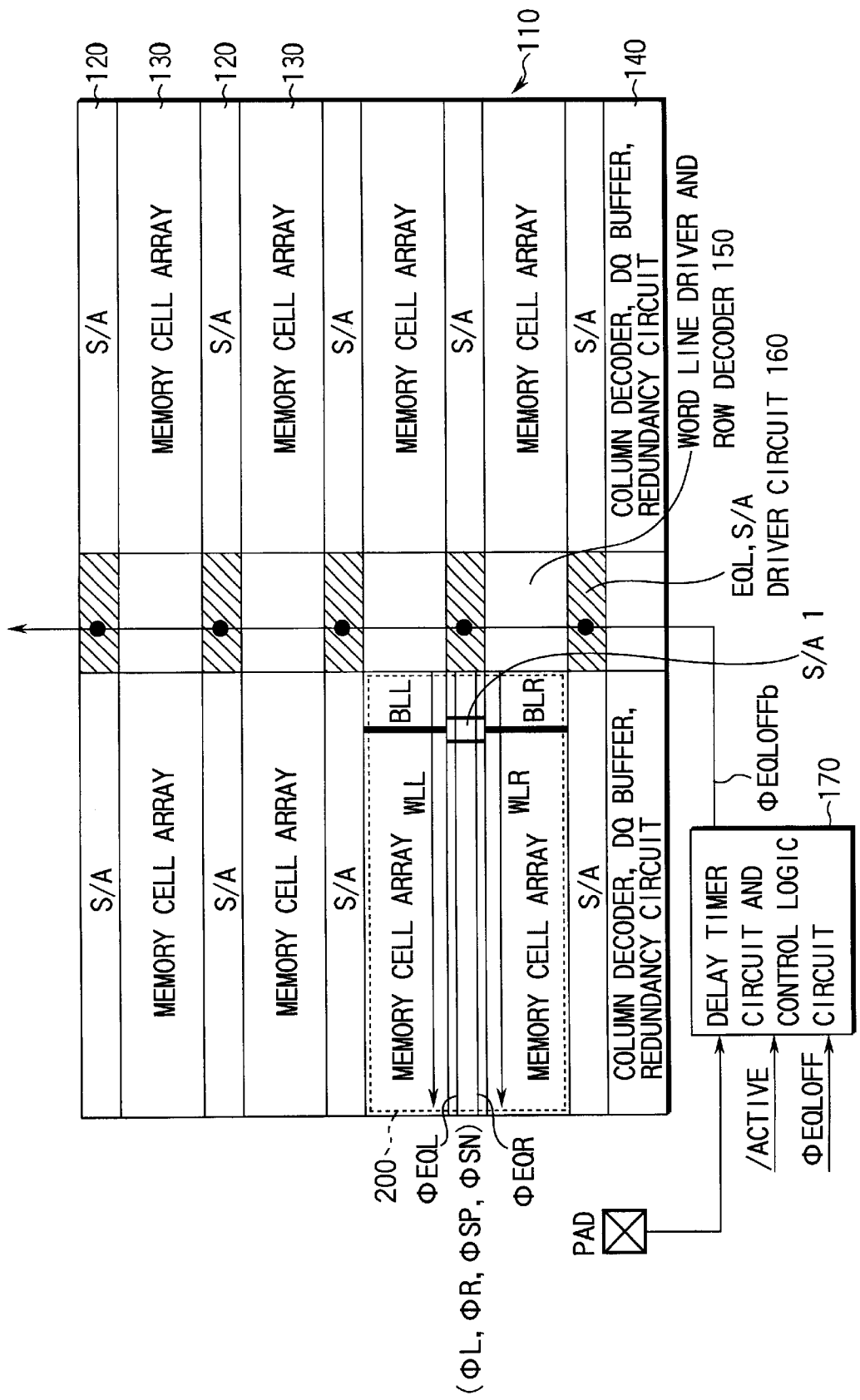
FIG. 6 is a circuit diagram showing the circuit construction of an enlarged part of the circuit shown in FIG. 5.
Figure 7:
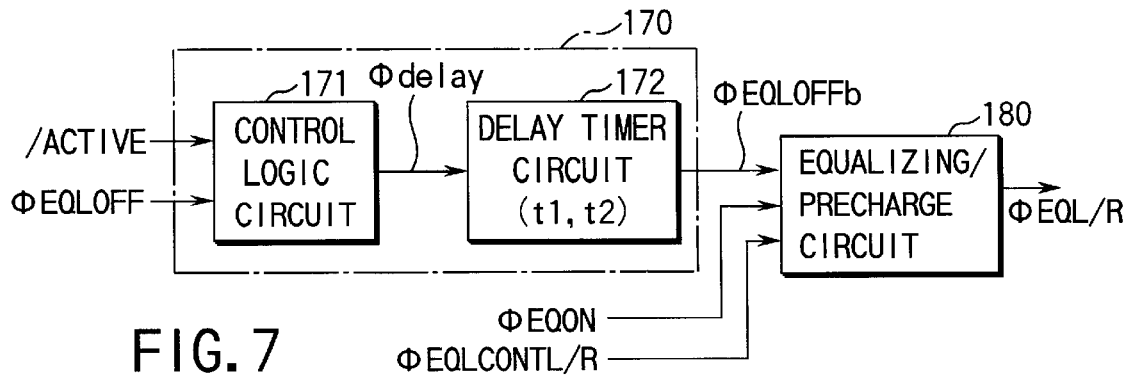
FIG. 7 is a block diagram showing an extracted circuit portion relating to the precharge and equalizing portion in the circuit shown in FIG. 6.
Figure 8:
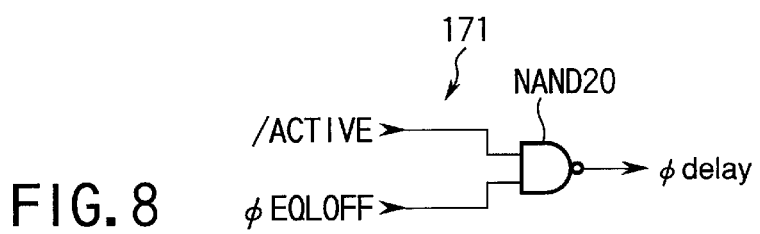
FIG. 8 is a circuit diagram showing an example of the construction of a control logic circuit in the circuit shown in FIG. 7.
Figure 9:
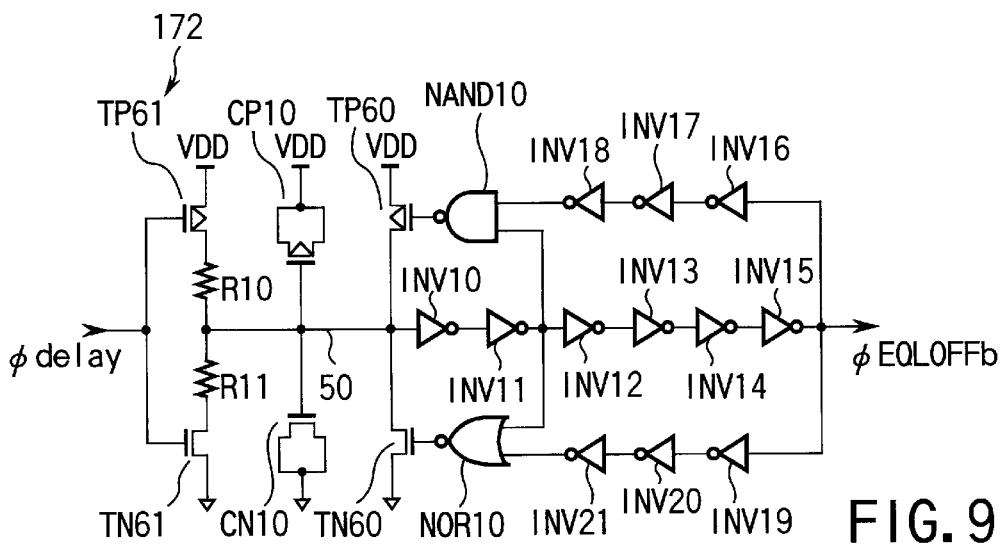
FIG. 9 is a circuit diagram showing an example of the construction of a delay timer circuit in the circuit shown in FIG. 7.
Figure 10:
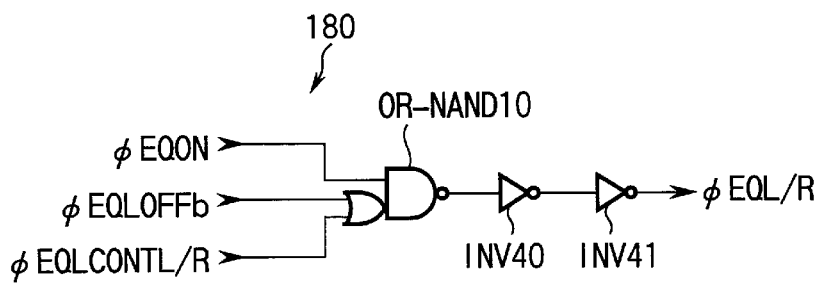
FIG. 10 is a circuit diagram showing an example of the construction of an equalizing/precharge circuit in the circuit shown in FIG. 7.
Figure 11:
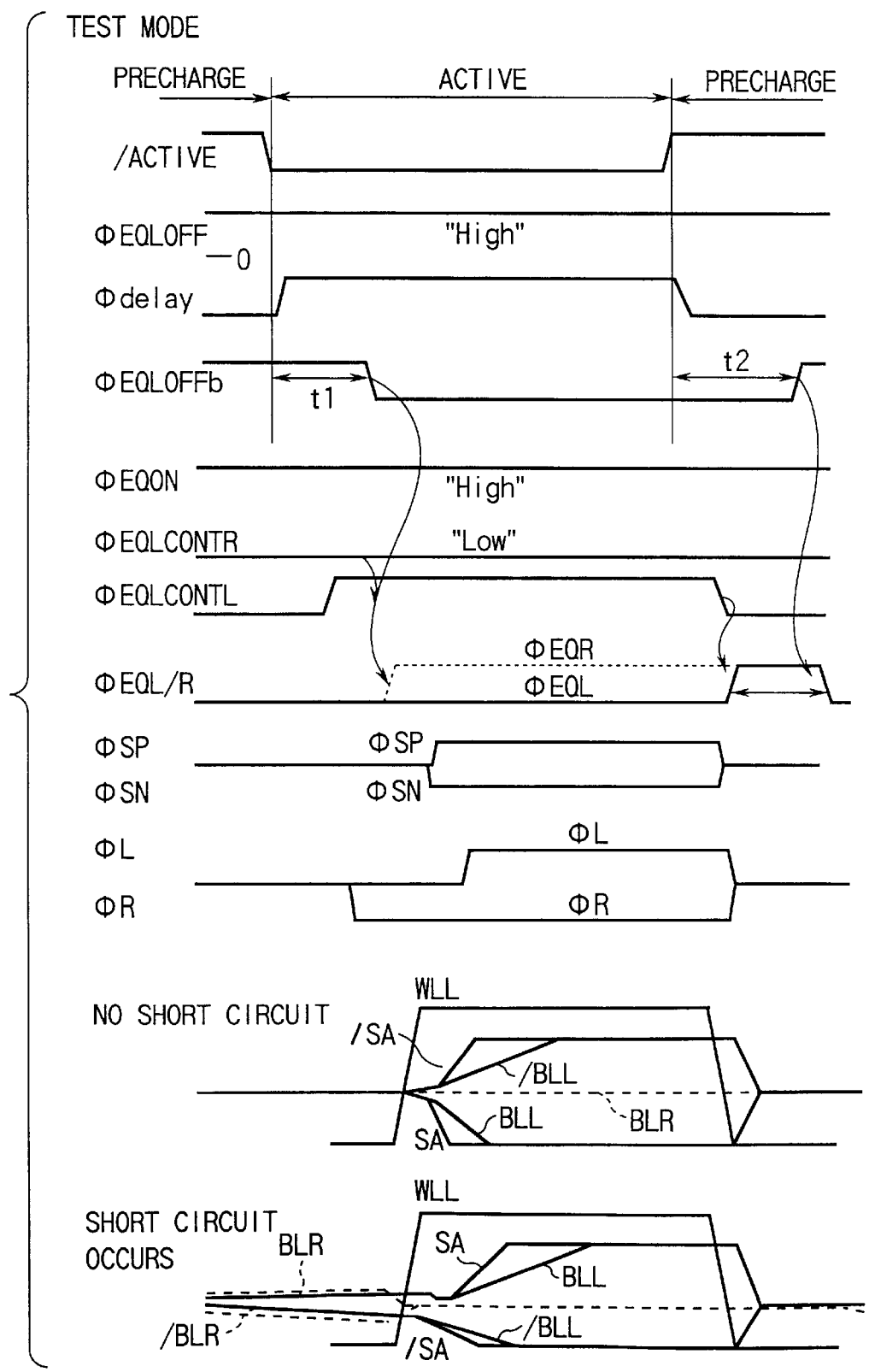
FIG. 11 is a timing chart showing operation waveforms in a test mode when one word line is selected, for illustrating the operation of the semiconductor memory device shown in FIGS. 5 to 10.
Figure 12:
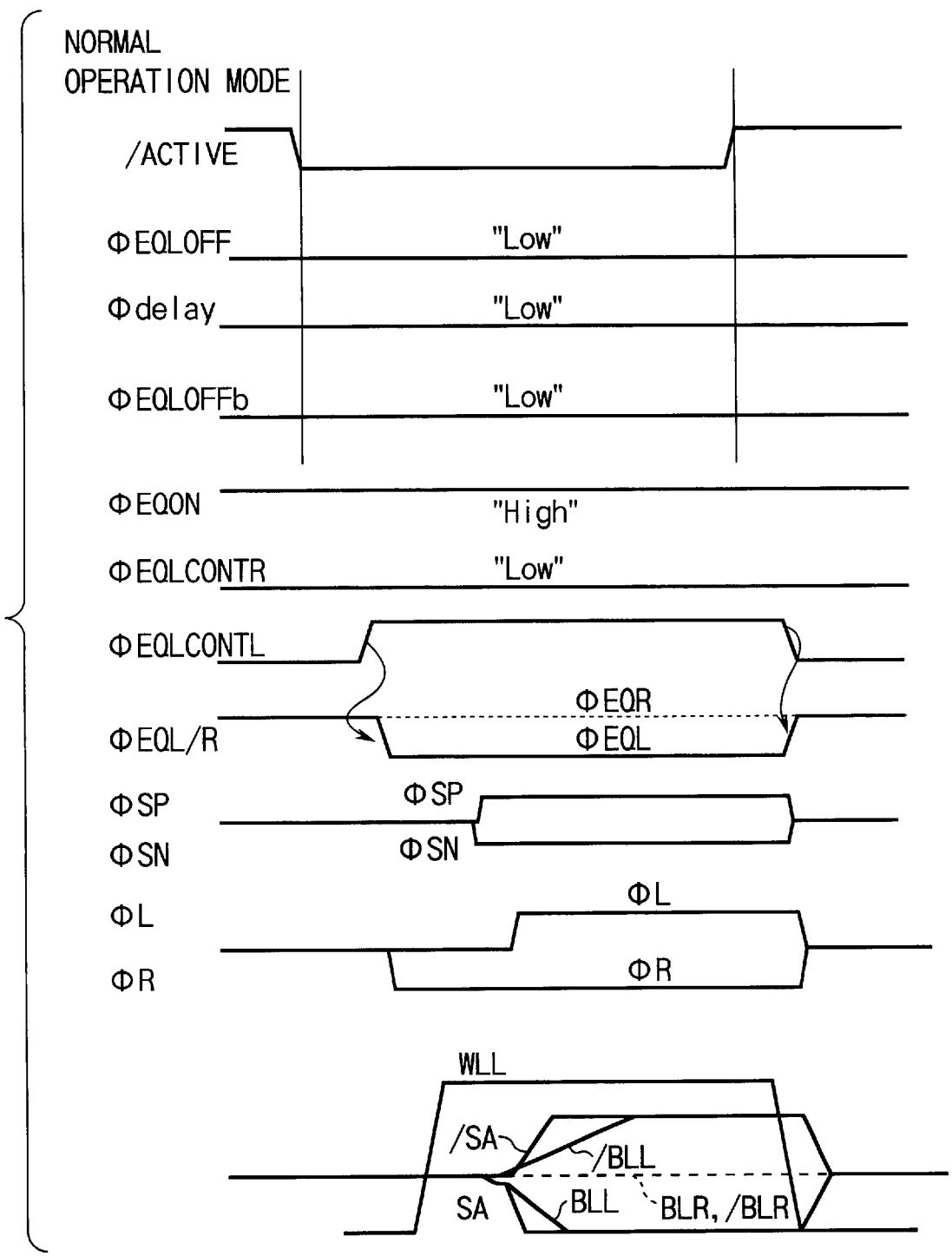
FIG. 12 is a timing chart showing operation waveforms in a normal operation mode when one word line is selected, for illustrating the operation of the semiconductor memory device shown in FIGS. 5 to 10.

FIG. 5 is a plan view showing the pattern layout of a chip, for illustrating a semiconductor memory device according to a first embodiment of this invention. FIG. 6 shows the circuit construction of an enlarged part of the circuit shown in FIG. 5. FIG. 7 is a block diagram showing an extracted circuit portion relating to the precharge and equalizing portion in the circuit shown in FIG. 6. FIG. 8 is a circuit diagram showing an example of the construction of a control logic circuit in the circuit shown in FIG. 7, FIG. 9 is a circuit diagram showing an example of the construction of a delay timer circuit in the circuit shown in FIGS. 7 and 10 is a circuit diagram showing an example of the construction of an equalizing/precharge circuit in the circuit shown in FIG. 7. Further, FIGS. 11 and 12 are timing charts showing operation waveforms obtained when a word line WLL is selected, and FIGS. 11 and 12 respectively show the test mode and normal operation mode.

First, the schematic construction of a semiconductor memory device to which this invention is applied is explained. In the pattern layout shown in FIG. 5, a DRAM is used as an example. Four memory cell blocks 101 to 104 are arranged on a chip 100 and pads 105 for inputting/outputting control signals and data are arranged in an area between the memory cell blocks 101 and 102 and in an area between the memory cell blocks 103 and 104. Further, various control circuits 106 are arranged in an area between the memory cell blocks 101 and 103 and in an area between the memory cell blocks 102 and 104.

FIG. 6 is a block diagram showing a portion which is obtained by enlarging a hatched area of the pattern layout shown in FIG. 5. Memory cell arrays 130 are arranged on both sides of each sense amplifier (S/A) 120 and a column decoder, DQ buffer and redundancy circuit 140 are arranged on the end portion of each area in which the sense amplifiers (S/A) 120 and memory cell arrays 130 are alternately arranged.

A word line driver and row decoder 150 is arranged in each area between the memory cell arrays 130 in the lateral direction and an EQL, S/A driver circuit 160 is arranged in each area between the sense amplifiers 120 in the lateral direction. A control signal is supplied from the exterior to a delay timer circuit and control logic circuit 170 via a pad PAD, an internal activation signal /ACTIVE and test mode entry signal φEQLOFF are also supplied thereto and the circuit outputs a timer output signal φEQLOFFb.

Figure 1:
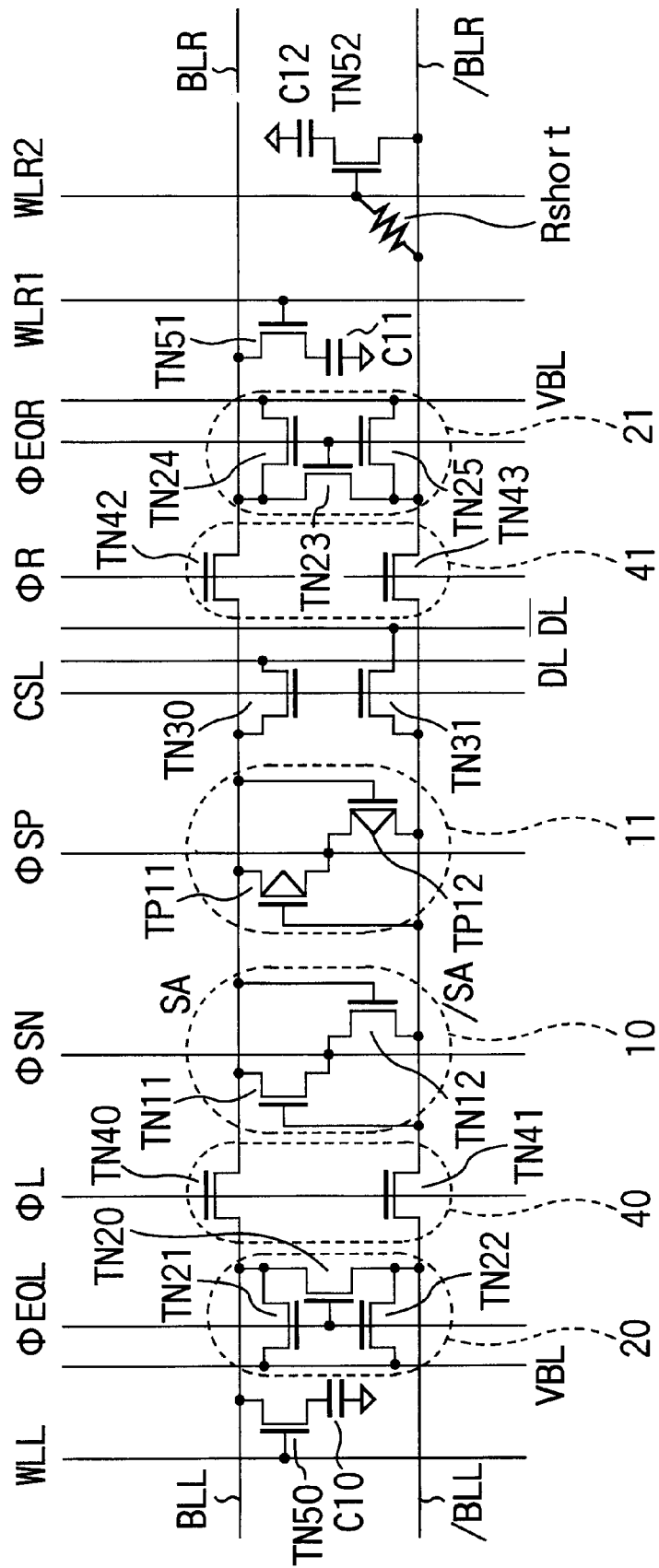
FIG. 1 is a circuit diagram showing an example of a representative shared sense amplifier and bit line precharge/equalizing circuit, for illustrating the conventional semiconductor memory device.
Figure 2:
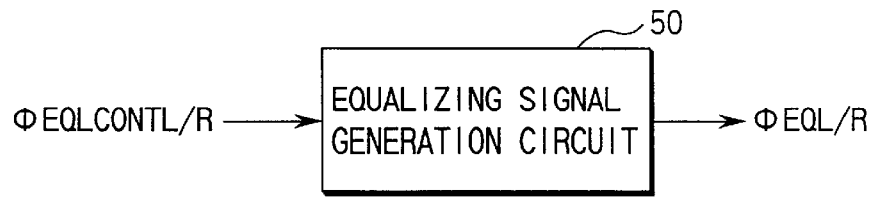
FIG. 2 is a block diagram showing a circuit for generating a precharge/equalizing circuit control signal based on an equalizing/precharge circuit control signal.
Figure 3:
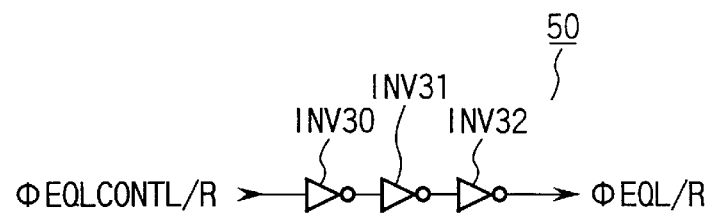
FIG. 3 is a circuit diagram showing an example of the detail construction of the equalizing signal generation circuit shown in FIG. 2.
Figure 4:
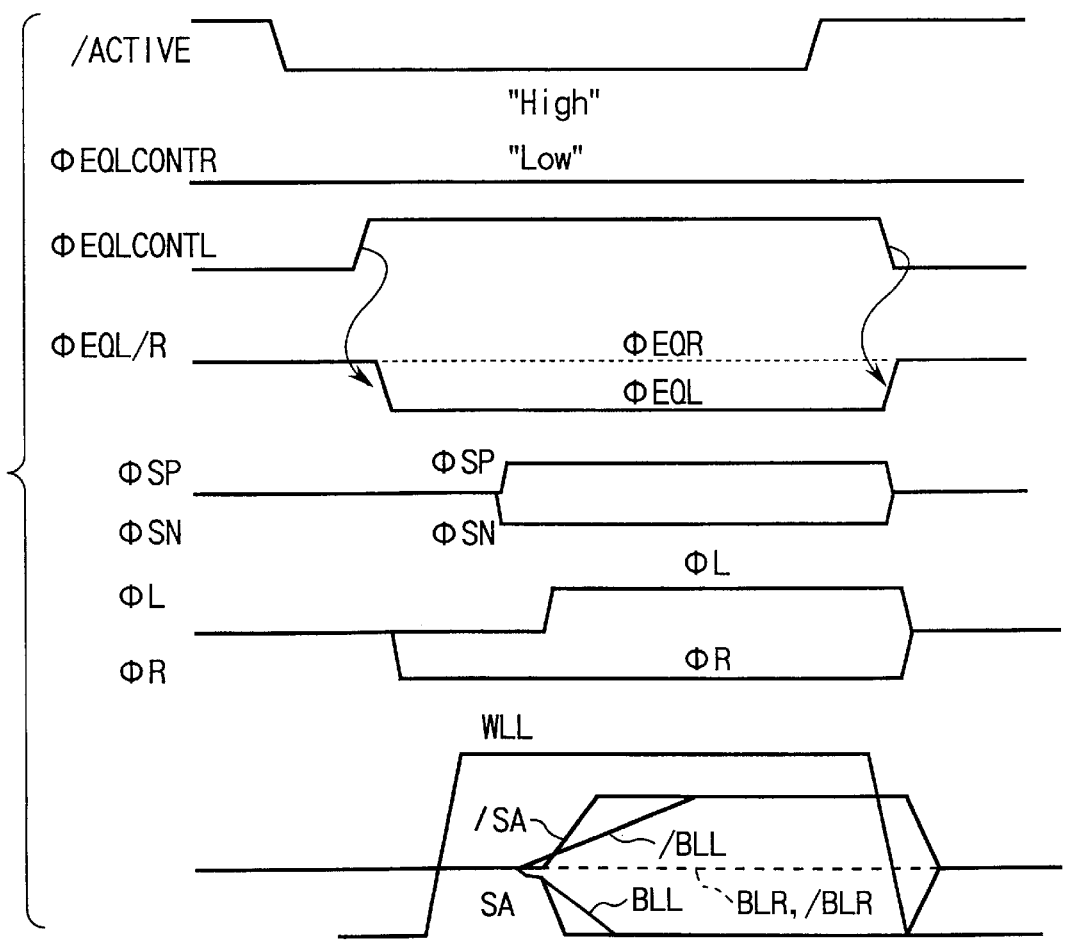
FIG. 4 is a timing chart showing operation waveforms obtained in a case where one word line is selected the circuit shown in FIG. 1.

An area surrounded by broken lines 200, that is, a portion including a sense amplifier and memory cell arrays arranged on both sides of the sense amplifier has the same construction as that of the circuit shown in FIG. 1.

As shown in FIG. 7, the delay timer circuit and control logic circuit 170 includes a control logic circuit 171 and delay timer circuit 172. The control logic circuit 171 is supplied with the internal activation signal /ACTIVE and test mode entry signal φEQLOFF and outputs a signal φdelay. The delay timer circuit 172 is supplied with the delay timer circuit input signal φdelay output from the control logic circuit 171 and outputs a timer output signal φEQLOFFb. The timer output signal φEQLOFFb is supplied to an equalizing/precharge circuit 180. The equalizing/precharge circuit 180 is also supplied with a signal φEQON and control signal φEQLCONTL/R and outputs a signal φEQL/R.

As shown in FIG. 8, the control logic circuit 171 includes a NAND gate NAND20. The NAND gate NAND20 is supplied with the internal activation signal /ACTIVE at one input terminal and the test mode entry signal φEQLOFF at the other input terminal and outputs the signal φdelay.

As shown in FIG. 9, the delay timer circuit 172 includes P-channel MOS transistors TP60, TP61, N-channel MOS transistors TN60, TN61, resistors R10, R11, capacitors CP10, CN10, NAND gate NAND10, NOR gate NOR10 and inverters INV10 to INV21. The delay timer circuit input signal φdelay is supplied to the gates of the MOS transistors TP61, TN61. The current path of the MOS transistor TP61, the resistors R10, R11 and the current path of the MOS transistor TN61 are serially connected between a power supply VDD and a ground node. The capacitor CP10 is connected between the connection node of the resistors R10 and R11 and the power supply VDD and the capacitor CN10 is connected between the connection node of the resistors R10 and R11 and the ground node. The capacitor CP10 is constructed by a P-channel MOS transistor whose source and drain are connected together and the capacitor CN10 is constructed by an N-channel MOS transistor whose source and drain are connected together.

Further, the current path of the P-channel MOS transistor TP60 is connected between the connection node of the resistors R10 and R11 and the power supply VDD and the current path of the N-channel MOS transistor TN60 is connected between the connection node of the resistors R10 and R11 and the ground node. The output terminal of the NAND gate NAND10 is connected to the gate of the MOS transistor TP60 and the output terminal of the NOR gate NOR10 is connected to the gate of the MOS transistor TN60. The potential of the connection node of the resistors R10 and R11 is supplied to one input terminal of the NAND gate NAND10 via the inverters INV10 to INV18 and the potential of the connection node of the resistors R10 and R11 is supplied to the other input terminal thereof via the inverters INV10 and INV11. The potential of the connection node of the resistors R10 and R11 is supplied to one input terminal of the NOR gate NOR10 via the inverters INV10 to INV15, INV19 to INV21 and the potential of the connection node of the resistors R10 and R11 is supplied to the other input terminal thereof via the inverters INV10 and INV11. A timer output signal φEQLOFFb is output from the output terminal of the inverter INV15.

The equalizing/precharge circuit 180 includes an OR gate and NAND gate OR-NAND10 and inverters INV40, INV41. The timer output signal φEQLOFFb and equalizing/precharge circuit control signal φEQLCONTL/R are respectively supplied to the input terminals of the OR gate and the output signal of the OR gate and the signal φEQON are supplied to the NAND gate. An output signal of the OR gate and NAND gate OR-NAND10 is supplied via the inverters INV40, INV41 as the precharge/equalizing circuit control signal φEQL/R.

Next, the operation of the circuit with the above construction is explained with reference to FIGS. 1, 11 and 12. In FIG. 11, cases in which the short circuit occurs and does not occur between the bit line /BLR and the word line WLR2 when "0" data is read out from the memory cell constructed by the cell transistor TN50 and cell capacitor C10 to the bit line BLL in the circuit shown in FIG. 1 are shown.

If the chip internal activation signal /ACTIVE using an external signal as a trigger signal is changed from the high level to the low level, the equalizing/precharge control signal φEQLCONTL is set to the high level. As a result, in the normal operation, the bit switch control signal φR of the bit line disposed on the opposite side of the selected bit line is set to the low level to electrically separate the non-selected side bit line from the sense amplifier and the equalizing/precharge circuit 180 on the selected bit line pair side is turned OFF to interrupt the equalizing operation, thus making ready for readout of cell data.

If the test mode entry signal φEQLOFF is set at the high level in the test mode of this embodiment, all of the equalizing/precharge circuits 180 are set in the OFF state and the chip internal activation signal /ACTIVE is changed from the high level to the low level, and therefore, the delay timer circuit input signal φdelay is set to the high level and then, after the passage of preset period time t1, the timer output signal φEQLOFFb is set to the low level. As a result, the equalizing/precharge circuit control signal φEQR on the non-selected side is set to the high level to start the equalizing operation.

In this case, however, since the equalizing/precharge control signal φEQLCONTL is already set at the high level, the equalizing/precharge circuit control signal φEQL on the selected side bit line is kept at the low level and the equalizing/precharge circuit 180 of the selected side bit line is not activated. The above period t1 is so set that the selected bit line potentials will not be equalized by setting the timer output signal φEQLOFFb to the low level after the control signal φEQLCONTL is set to the OFF state, that is, the control signal is set to the high level in this embodiment and thus the equalizing operation prior to the readout of data of the selected bit line can be suppressed.

If no short circuit occurs between the bit line and the word line and when the word line WLL is selected, the cell transistor TN50 is turned ON and "0" data is read out from the memory cell constructed by the cell transistor TN50 and cell capacitor C10 to the bit line BLL, then the data is correctly amplified by the sense amplifiers 10, 11, and the bit line BLL and /BLL are respectively set to the low and high potential levels.

On the other hand, if a short circuit occurs between the word line WLR2 and the bit line /BLR on the opposite side of the memory cell in which the readout operation is effected with the sense amplifiers 10, 11 disposed therebetween, the following operation is effected. At the test mode entry time, the equalizing/precharge circuit 180 is set in the OFF state during the precharge period and the bit line potentials are not equalized. Since the bit line precharge/equalizing circuit 21 is set in the OFF state during the precharge period, the potential level of the bit line /BLR which is short-circuited with the word line WLR2 is gradually lowered to the ground potential. At this time, the potential level of the bit line /BLL is also lowered. Since no leakage current flows in the bit lines BLR and BLL, the bit line precharge potential VBL is kept unchanged. In this case, if the word line WLL is selected, a readout potential obtained when "0" data is read out from the memory cell C10 connected to the bit line BLL is set to Vr, a potential of the bit line BLL immediately before the readout operation is set to V(BLL), and a potential of the bit line /BLL is set to V(/BLL) and when the relation of V(BLL)−Vr>V(/BLL) is attained, then V(BLL) is equal to the precharge/equalizing potential VBL but the level of V(/BLL) is lowered due to the leakage current. If the level lowering amount is larger than the readout potential difference Vr of the memory cell, the level of V(BLL) is still higher than the level of V(/BLL) and sensed as a high level even if "0" data is read out to the bit line BLL, and as a result, the defect can be detected.

That is, in a case where the potential drop of the bit line due to the leakage current of the bit line is larger than the readout potential difference Vr of the memory cell, it becomes possible to detect the defect due to the leakage current of the bit line without fail. Therefore, the defect screening operation can be rapidly effected and it becomes possible to screen a bit line which lies on the opposite side of the bit line associated with the bit line-word line short circuit with the sense amplifier disposed therebetween.

If the precharge period is made variable, that is, time in which the bit line precharge/equalizing circuit is kept in the OFF state is made variable, it becomes possible to freely change the degree of screening.

In the normal operation mode, all of the test mode entry signal φEQLOFF, delay timer circuit input signal φdelay and timer output signal φEQLOFFb are set at the low level and the signal φEQON is set at the high level so as to permit substantially the same operation as in the conventional case to be effected.

[Second Embodiment]

Figure 13:
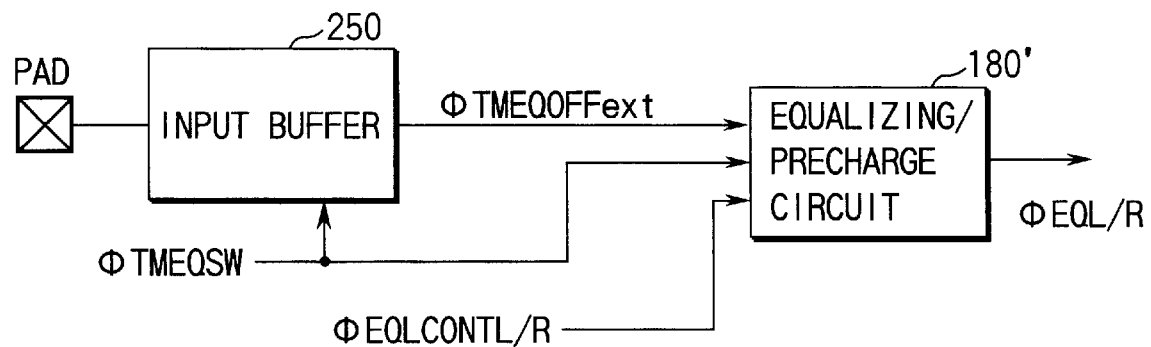
FIG. 13 is a block diagram showing an extracted circuit portion relating to the precharge and equalizing portion, for illustrating a semiconductor memory device according to a second embodiment of this invention.
Figure 14:
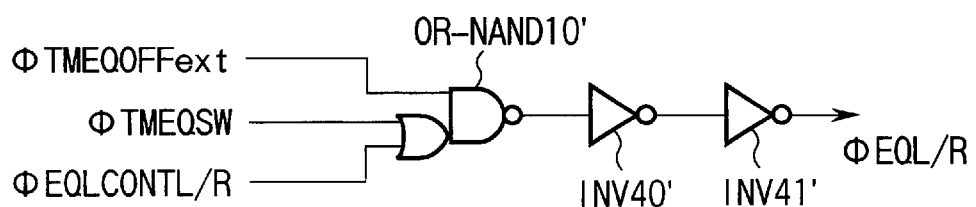
FIG. 14 is a circuit diagram showing an precharge/equalizing circuit in the circuit shown in FIG. 13.
Figure 15:
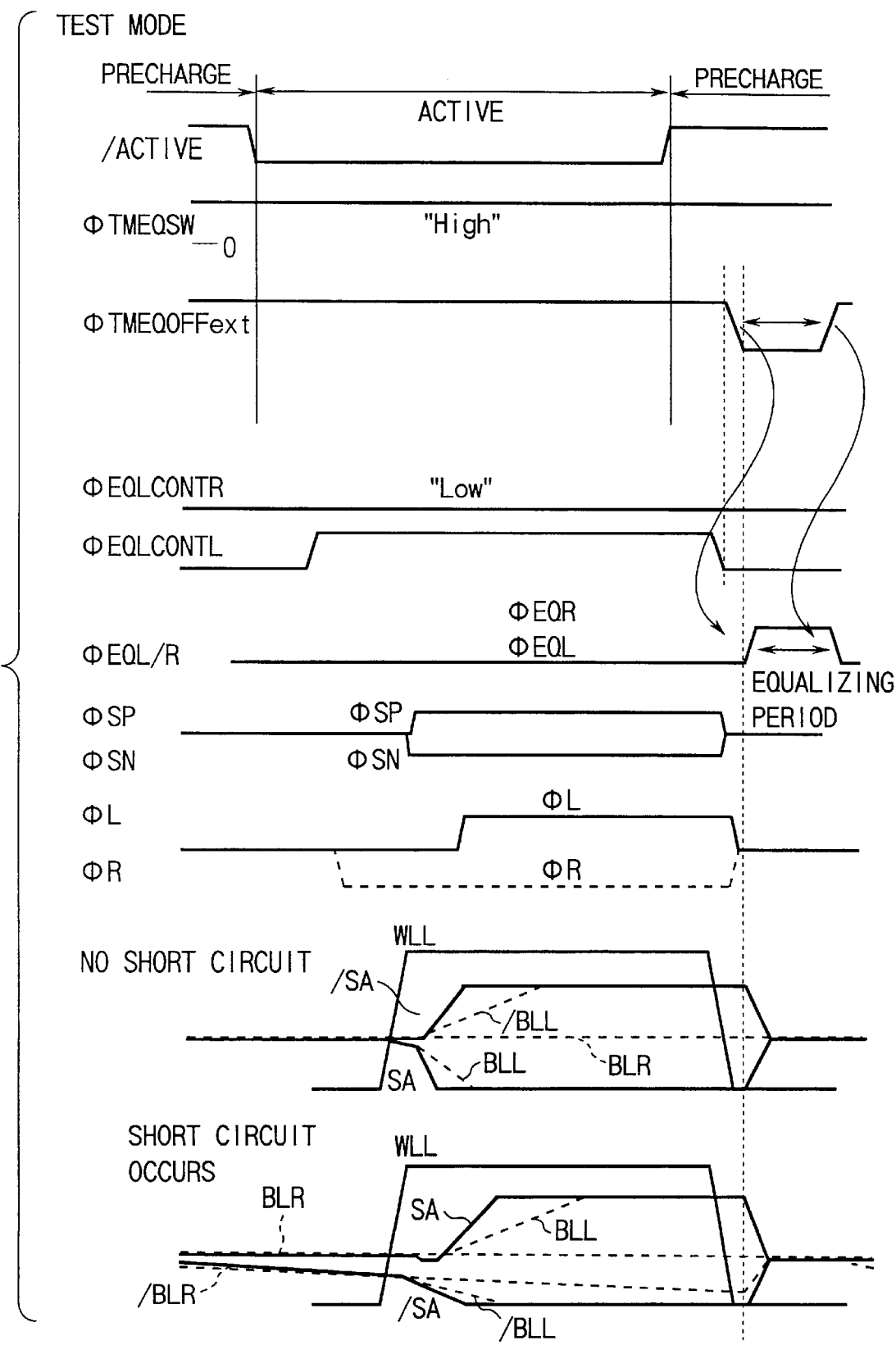
FIG. 15 is a timing chart showing operation waveforms in a test mode when one word line is selected, for illustrating the operation of the semiconductor memory device shown in FIGS. 13 and 14.
Figure 16:
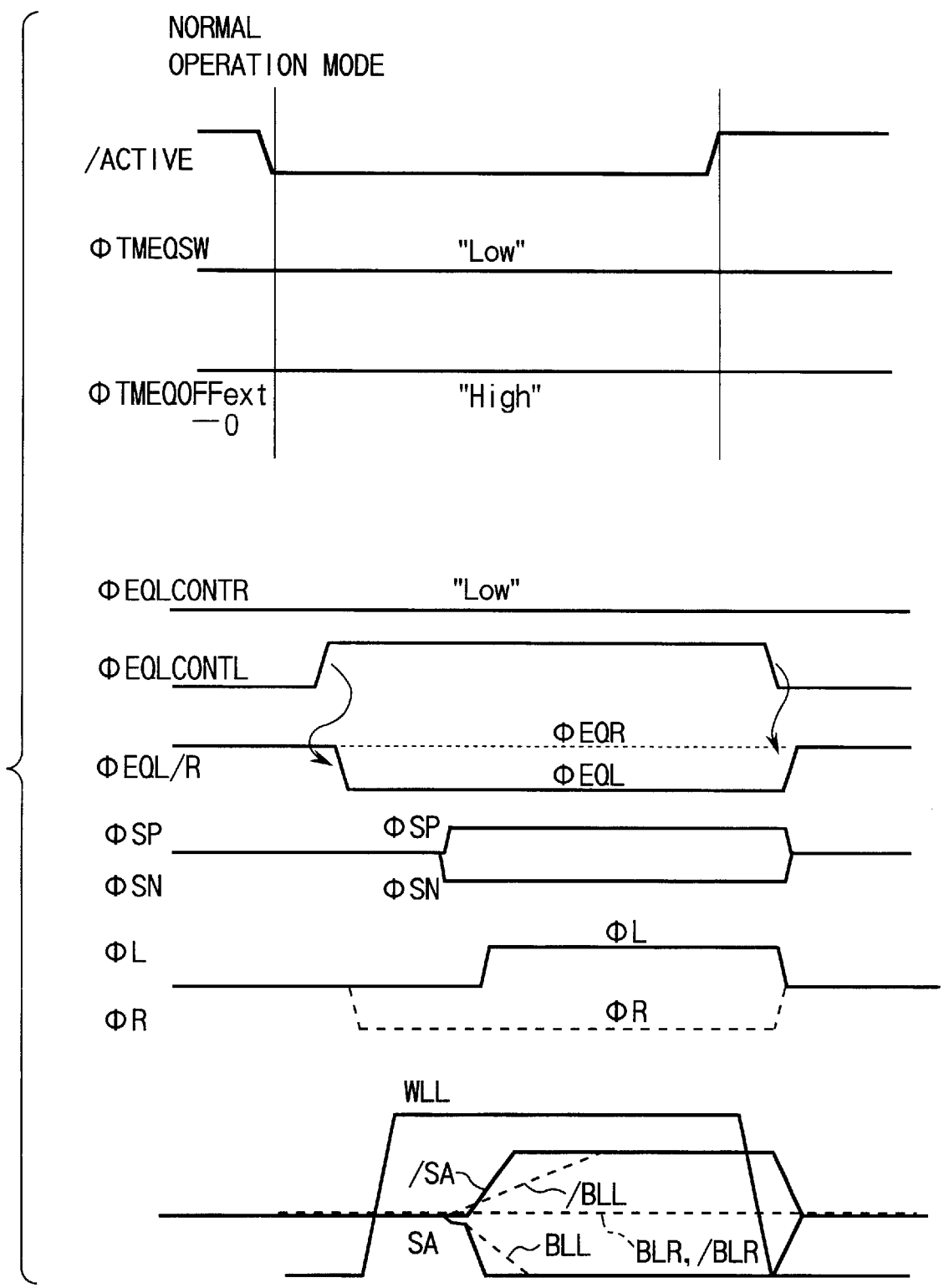
FIG. 16 is a timing chart showing operation waveforms in a normal operation mode when one word line is selected, for illustrating the operation of the semiconductor memory device shown in FIGS. 13 and 14.

A semiconductor memory device according to the second embodiment of the invention will be described, with reference to FIGS. 13 to 16. FIG. 13 is a block diagram showing an extracted circuit portion relating to the precharge and equalizing portion shown in FIG. 6. FIG. 14 is a circuit diagram of the equalizing/precharge circuit shown in FIG. 13. FIGS. 15 and 16 are timing charts, both illustrating the waveforms various signals have when a word line WLL is selected. More specifically, FIG. 15 shows the waveforms the signals have in the test mode, and FIG. 16 the waveforms the signals have in the normal operation mode.

As shown in FIG. 13, the second embodiment has an input buffer 250 and an equalizing/precharge circuit 180'. The input buffer 250 is provided, in place of the control logic circuit 171 and delay timer circuit 172, both incorporated in the circuit shown in FIG. 7. The equalizing/precharge circuit 180' receives a trigger signal that is an externally input signal, not an output signal of the delay timer circuit 171. Upon receipt of the externally input signal, the circuit 180' stops the equalizing operation.

In operation, a control signal is supplied from an external device to the pad PAD. The control signal is input to the input buffer 250 when an external input signal (test mode on/off signal) φTMEQSW is supplied to the input buffer 250.

The input buffer 250 generates a signal φTMEQOFFext (equalize control output signal). The signal φTMEQOFFext is supplied to the equalizing/precharge circuit 180', together with the external input signal φTMEQSW, and the equalizing/precharge circuit control signal φEQLCONL/R described above. The equalizing/precharge circuit 180' outputs a precharge/equalizing circuit control signal φEQL/R.

As shown in FIG. 14, the equalizing/precharge circuit 180' has a logic architecture identical to the one illustrated in FIG. 10. Namely, the circuit 180' comprises an OR gate and NAND gate OR-NAND10', and inverters INV40' and INV41'. The external input signal φTMEQSW and equalizing/precharge circuit control signal φEQLCONL/R are supplied to the inputs of the OR gate. The output signal of the OR gate and the output signal φTMEQOFFext of the input buffer 250 are supplied to the OR gate and NAND gate OR-NAND10'. The output signal of the OR gate and NAND gate OR-NAND10' is output via the inverters INV40' and INV41', as the precharge/equalizing circuit control signal φEQL/R.

How the second embodiment shown in FIGS. 13 and 14 operates will be described, with reference to the timing charts of FIGS. 15 and 16. FIG. 15 shows how the embodiment operates in two cases. In the first case, the bit line /BLR and the word line WLR are short-circuited as a "0" data is read from a memory cell to the bit line BLL. In the second case, the lines /BLR and the word line WLR are not short-circuited as a "0" data is read from the memory cell to the bit line BLL.

When the external input signal φTMEQSW rises to the "High" level, the semiconductor memory device is set into the test mode. Thus, the input buffer 250 receive a control signal form the pad PAD. The input buffer 250 generates an equalize control signal φTMEQOFFext. As shown in FIG. 15, the precharge/equalizing circuit control signal φEQL/R is not related to an internal activation signal /ACTIVE; it is controlled by the equalize control signal φTMEQOFFext only.

When the external input signal φTMEQSW is set at the "Low" level as shown in FIG. 16, the semiconductor memory device is set into the normal operating mode. The equalize control signal φTMEQOFFext is therefore fixed at the "High" level. Thus, the second embodiment operates in almost the same way as the first embodiment.

In the second embodiment, any bit line which is connected one side of a sense amplifier and from which a current leaking and the bit line connected to the other side of the sense amplifier can be easily screened in the same way as in the first embodiment. In addition, the bit-line equalizing/precharge circuit can be controlled whenever desired. Hence, the second embodiment still provided in a wafer can be tested for defects, and any part of the second embodiment, where defects are found, can be replaced by a redundant circuit. This increases the manufacturing yield of the second embodiment and prevents defective products from being delivered into the market.

[Third Embodiment]

Figure 17:
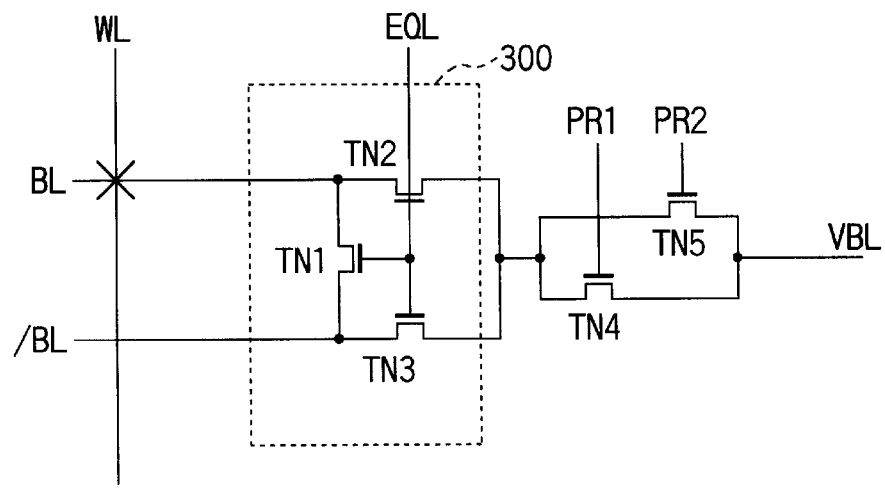
FIG. 17 is a circuit diagram showing an extracted portion including a word line, bit line pair, bit line precharge/equalizing circuit and a current limiting element which limits a bit line precharge current, for illustrating a semiconductor memory device according to a third embodiment of this invention.

FIG. 17 illustrates a semiconductor memory device according to a third embodiment of this invention and shows an extracted portion including a word line WL, paired bit lines BL, /BL, bit line precharge/equalizing circuit 300 and a current limiting element which limits a bit line precharge current. In FIG. 17, a case wherein the bit line BL is short-circuited with the word line WL is shown.

The circuit shown in FIG. 17 includes N-channel precharge/equalizing transistors TN1, TN2, TN3 and bit line precharge current limiting transistors TN4, TN5. The current path of the precharge/equalizing transistor TN1 is connected between the paired bit lines BL and /BL. One end of the current path of the precharge/equalizing transistor TN2 is connected to the bit line BL. One end of the current path of the precharge/equalizing transistor TN3 is connected to the bit line /BL and the other end thereof is connected to the other end of the current path of the precharge/equalizing transistor TN2. A precharge/equalizing signal EQL is supplied to the gates of the bit line precharge/equalizing transistors TN1, TN2, TN3. One end of the current path of the current limiting transistor TN4 is connected to the other ends of the current paths of the transistors TN2, TN3 and the gate thereof is supplied with a gate input signal (control signal) PR1. One end of the current path of the current limiting transistor TN5 is connected to the other ends of the current paths of the transistors TN2, TN3, the other end of the current path thereof is connected to the other end of the current path of the transistor TN4 and the gate thereof is supplied with a gate input signal (control signal) PR2.

The word line WL is arranged to intersect the paired bit lines BL, /BL and short-circuited with the bit line BL as indicated by a × mark.

A bit line precharge potential VBL is applied to the connection node of the current limiting transistors TN4 and TN5.

As shown in FIG. 17, in this embodiment, the two current limiting transistors (current limiting elements) TN4, TN5 are provided between the sources of the bit line precharge/equalizing transistors TN2, TN3 and a wiring for supplying the bit line precharge potential VBL generated from the bit line precharge potential generation circuit.

Figure 18:
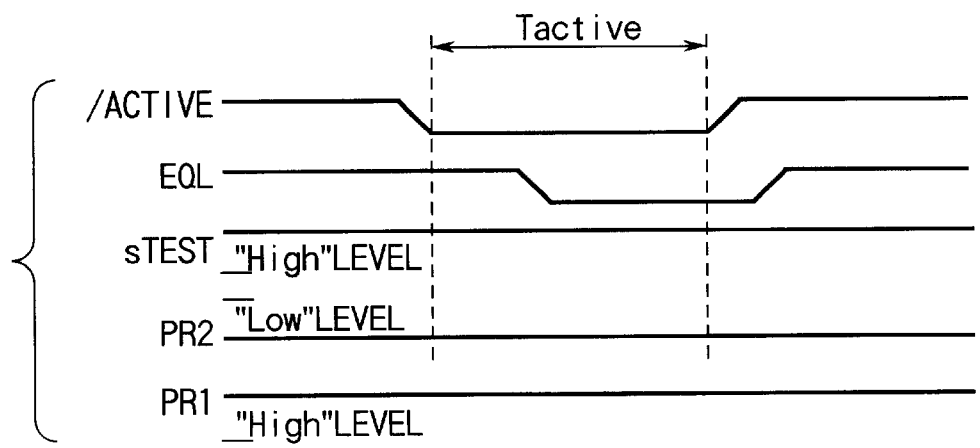
FIG. 18 is a timing chart showing operation waveforms for illustrating the operation of the circuit shown in FIG. 17.

As shown in the waveform diagram of FIG. 18, when the chip is set in the standby state, the equalizing signal EQL is set to the high level to set the transistors TN1, TN2, TN3 into the ON state so that the precharge potential VBL will be applied to the paired bit lines BL, /BL via the current limiting transistor TN4. In this case, the current supplying ability of the transistor TN4 is set lower in comparison with the conventional current limiting element. On the other hand, since the gate signal PR2 of the current limiting transistor TN5 is set at the low level in the standby state, the precharge current is supplied to the paired bit lines BL, /BL in the standby state only via the current limiting transistor TN4 whose conductance is low. Therefore, even if the short circuit occurs between the bit line BL and the word line WL, only a small leakage current will flow.

A signal sTEST in the operation waveform diagram of FIG. 18 is a test control signal used for the test when the screening operation for the bit line associated with the short circuit between the bit line and the word line is accelerated.

However, since the conductance of the current limiting transistor TN4 is set lower than that in the conventional case as described before, the paired bit lines BL, /BL cannot be charged to a desired precharge level in some cases. In the actual read operation, in a case where the precharge potential does not reach the desired level (which is generally set at a potential level which is half the high level of the bit line potential) and cell data is read out to the bit line BL or /BL with the precharge potential set at the low level, the signal margin (an initial potential difference between the bit lines at the cell readout time) at the "0" readout time becomes smaller and there occurs a possibility that data may be erroneously sensed. On the other hand, in a case where the precharge potential of the bit line is set higher than the desired potential, the signal margin at the "1" readout time becomes smaller and there also occurs a possibility that data may be erroneously sensed.

Therefore, in order to solve the above problem and reduce the standby current, the current limiting transistor TN5 is newly provided and set into the On state only when the internal activation signal /ACTIVE whose level is changed in synchronism with an external activation signal is made active (set at the low level) so as to increase the supply amount of the precharge current to the paired bit lines BL, /BL.

For example, if a generation circuit which generates the control signal PR2 to the current limiting transistor TN5 and includes inverters INV1, INV2 and NAND gate NAND1 is used (see FIG. 19), then both of the transistors TN4, TN5 are set into the ON state when the internal activation signal /ACTIVE is made active (low level), and thus, the conductance is set substantially higher in comparison with a case of the standby state so as to precharge the bit lines to the desired precharge potential level.

Figure 19:
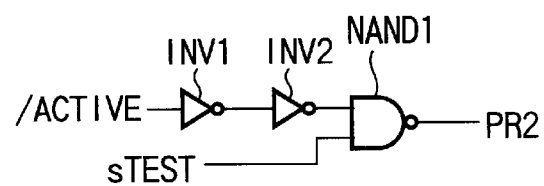
FIG. 19 is a circuit diagram showing an example of the construction of a generation circuit for generating a control signal to a current limiting transistor.

Further, according to the circuit shown in FIG. 19, it is also possible to attain an advantage that the bit line having the leakage current can be effectively screened by setting the test control signal STEST at the high level only at the time of the screening operation to reduce the precharge current to the paired bit lines BL, /BL.

Figure 20:
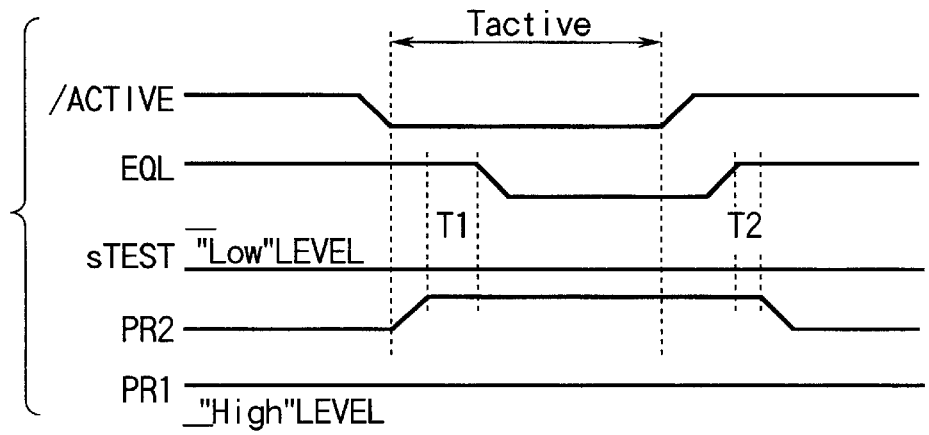
FIG. 20 is a timing chart showing operation waveforms obtained in a case where the control signal output from the circuit shown in FIG. 19 is used.

The control waveform signals in the test mode are shown in FIG. 20. As described before, since the signal STEST is set at the high level in the test mode, the current limiting transistor TN5 is normally kept in the OFF state and the control signal PR1 is normally kept at the high level, the precharge current to the bit line becomes extremely smaller. Therefore, the defect caused by a reduction in the signal margin which is caused by a lowering in the precharge potential of the bit line due to the bit line leakage current can be effectively screened and effectively replaced by a redundancy circuit.

Figure 21:
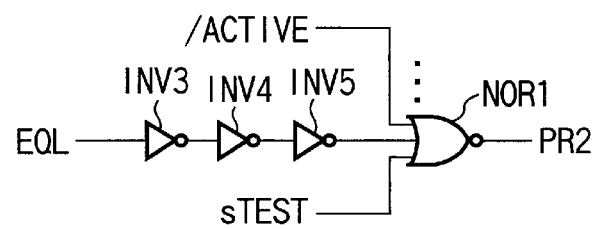
FIG. 21 is a circuit diagram showing another example of the construction of a generation circuit for generating a control signal to the current limiting transistor.

FIG. 21 shows another example of the construction of a generation circuit for generating the control signal PR2. The circuit includes inverters INV3, INV4, INV5 and NOR gate NOR1.

Figure 22:
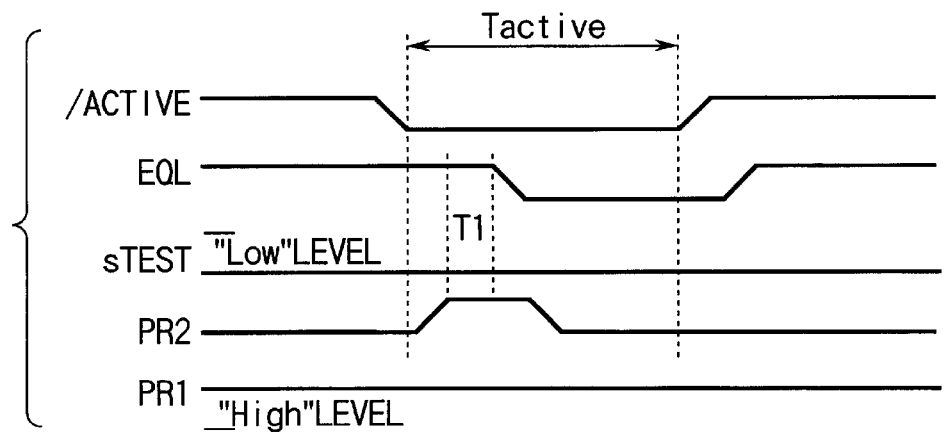
FIG. 22 is a timing chart showing operation waveforms obtained in a case where the control signal output from the circuit shown in FIG. 21 is used.

FIG. 22 is a timing chart showing operation waveforms obtained in a case where the control signal output from the circuit shown in FIG. 21 is used. With the above circuit construction, if the internal activation signal /ACTIVE is set to the low level, then the control signal PR2 is set to the high level, the current limiting transistor TN5 is turned ON to increase the precharge current and set the potentials of the paired bit lines BL, /BL to the desired precharge potential level and thus the "0" and "1" readout margins will be set to have the same range.

Next, the precharge/equalizing operation is released by setting the equalizing signal EQL to the low level immediately before the sense amplifier is activated and the current limiting transistor TN5 which is used for the active operation is set into the OFF state by resetting the control signal PR2 to the low level in response to setting of the equalizing signal EQL to the low level and only the current limiting transistor TN4 is set in the ON state until the next cycle active operation. As a result, the standby current can be reduced and the stable sense operation can be realized.

Therefore, according to the third embodiment, a significant reduction in the leakage current in the standby state and a sufficiently large readout margin can be simultaneously attained.

As described above, according to this invention, a semiconductor memory device in which a bit line having a leakage current can be effectively screened can be attained.

Further, a semiconductor memory device in which an increase in the standby current due to a bit line leakage current can be suppressed can be attained.

In addition, a semiconductor memory device in which the manufacturing test yield can be improved and the number of defective products in the market after the shipment of the products can be suppressed can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of word lines;
    paired bit lines arranged to intersect said plurality of word lines;
    a plurality of memory cells connected to said plurality of word lines and paired bit lines; and
    further including a bit line precharge/equalizing circuit for precharging said paired bit lines and equalizing potentials thereof, wherein a word line is selected;
    wherein a word line is deselected and said bit line precharge/equalizing circuit precharges said paired bit lines and equalizes the potentials thereof when an internal activation signal using an external signal as a trigger is set into a precharge state in a test mode, and after a delay of a preset period of time, said bit line precharge/equalizing circuit is set into an OFF state.

2. The semiconductor memory device according to claim 1, wherein the delay period of the preset period of time is set to a period in which said paired bit lines are set to the same potential and the precharge/equalizing operation is completed.

3. A semiconductor memory device comprising:
    a plurality of word lines;
    paired bit lines arranged to intersect said plurality of word lines;
    a plurality of memory cells connected to said plurality of word lines and paired bit lines; and
    further including a bit line precharge/equalizing circuit for precharging said paired bit lines and equalizing potentials thereof, wherein a word line is selected;
    wherein a word line is deselected and said bit line precharge/equalizing circuit precharges said paired bit lines and equalizes the potentials thereof when an internal activation signal using an external signal as a trigger is set into a precharge state in a test mode, and after a delay of a preset period of time, said bit line precharge/equalizing circuit is set into an OFF state; and
    wherein a screening operation is effected by sensing variations in the potentials of said paired bit lines after said bit line precharge/equalizing circuit is set into the OFF state.

4. The semiconductor memory device according to claim 3, wherein the delay period of the preset period of time is set to a period in which said paired bit lines are set to the same potential and the precharge.

5. A semiconductor memory device comprising:
    a plurality of word lines;
    paired bit lines arranged to intersect said plurality of word lines;
    a plurality of memory cells connected to said plurality of word lines and paired bit lines;
    a bit line precharge potential generation circuit for generating a bit line precharge potential for precharging said paired bit lines and equalizing the potentials thereof;
    a bit line precharge/equalizing circuit for applying the bit line precharge potential generated from said bit line precharge potential generation circuit to said paired bit lines to precharge said paired bit lines and equalize the potentials thereof; and
    a current limiting circuit disposed between said bit line precharge potential generation circuit and said bit line precharge/equalizing circuit, for limiting the precharge current flowing in said paired bit lines;
    wherein the precharge current for said paired bit lines is controlled by increasing the conductance of said current limiting circuit at the active time and reducing the conductance of said current limiting circuit at the standby time.

6. The semiconductor memory device according to claim 5, which further comprises redundancy paired bit lines; redundancy memory cells connected to said redundancy paired bit lines; and a redundancy circuit for substituting said redundancy paired bit lines and redundancy memory cells when a defect occurs in at least one of said paired bit lines and memory cells and in which the conductance of part of said current limiting circuit which is connected to said paired bit lines replaced by said redundancy circuit when a defect occurs in at least one of said paired bit lines and memory cells is reduced.

7. The semiconductor memory device according to claim 5, wherein said current limiting circuit includes a plurality of current limiting elements disposed between said bit line precharge potential generation circuit and said bit line precharge/equalizing circuit and used for limiting the precharge current for said paired bit lines, at least one of said plurality of current limiting elements is normally kept in the ON state and the conductances of the remaining current limiting elements are controlled by a control signal.

8. The semiconductor memory device according to claim 5, wherein said current limiting circuit includes a current limiting element which is set in the ON state in the standby state and set in the OFF state in the active state.

9. The semiconductor memory device according to claim 5, wherein said current limiting circuit includes a MOS transistor whose conductance is changed by controlling a gate voltage thereof.

10. A semiconductor memory device of shared sense amplifier system comprising:
    a plurality of word lines;
    first paired bit lines arranged to intersect said plurality of word lines;
    second paired bit lines arranged to intersect said plurality of word lines and disposed adjacent to said first paired bit lines;
    a sense amplifier commonly used for said first and second paired bit lines;
    a plurality of memory cells connected to said plurality of word lines and first and second paired bit lines;
    a first bit line precharge/equalizing circuit for precharging said first paired bit lines and equalizing the potentials thereof; and a second bit line precharge/equalizing circuit for precharging said second paired bit lines and equalizing the potentials thereof;

wherein said first and second bit line precharge/equalizing circuits precharge said first and second paired bit lines and equalize the potentials thereof when an internal activation signal using an external signal as a trigger is set into a precharge state in a test mode, and after the delay of a preset period of time, said first and second bit line precharge/equalizing circuits are set into an OFF state.

11. The semiconductor memory device according to claim 10, wherein the delay period of the preset period of time is set to a period in which said first and second paired bit lines are set to the same potential and the precharge/equalizing operation is completed.

12. The semiconductor memory device according to claim 10, wherein a screening operation is effected by sensing variations in the potentials of said first and second paired bit lines after said first and second bit line precharge/equalizing circuits are set into the OFF state.

13. A semiconductor memory device of shared sense amplifier system comprising:

a plurality of word lines;

first paired bit lines arranged to intersect said plurality of word lines;

second paired bit lines arranged to intersect said plurality of word lines and disposed adjacent to said first paired bit lines;

a sense amplifier commonly used for said first and second paired bit lines;

a plurality of memory cells connected to said plurality of word lines and first and second paired bit lines;

a bit line precharge potential generation circuit for generating a bit line precharge potential for precharging said first and second paired bit lines and equalizing the potentials thereof;

a first bit line precharge/equalizing circuit for applying the bit line precharge potential generated from said bit line precharge potential generation circuit to said first paired bit lines to precharge said first paired bit lines and equalize the potentials thereof;

a second bit line precharge/equalizing circuit for applying the bit line precharge potential generated from said bit line precharge potential generation circuit to said second paired bit lines to precharge said second paired bit lines and equalize the potentials thereof;

a first current limiting circuit disposed between said bit line precharge potential generation circuit and said first bit line precharge/equalizing circuit, for limiting the precharge current flowing in said first paired bit lines; and a second current limiting circuit disposed between said bit line precharge potential generation circuit and said second bit line precharge/equalizing circuit, for limiting the precharge current flowing in said second paired bit lines;

wherein the precharge currents for said paired bit lines are controlled by increasing the conductances of said first and second current limiting circuits at the active time and reducing the conductances of said first and second current limiting circuits at the standby time.

14. The semiconductor memory device according to claim 13, which further comprises redundancy paired bit lines; redundancy memory cells connected to said redundancy paired bit lines; and a redundancy circuit for substituting said redundancy paired bit lines and redundancy memory cells when a defect occurs in at least one of said first and second paired bit lines and memory cells and in which the conductance of one of said first and second current limiting circuits which is connected to a corresponding one of said first and second paired bit lines replaced by said redundancy circuit when a defect occurs in at least one of said first and second paired bit lines and memory cells is reduced.

15. The semiconductor memory device according to claim 13, wherein said first current limiting circuit includes a plurality of first current limiting elements disposed between said first bit line precharge potential generation circuit and said first bit line precharge/equalizing circuit and used for limiting the precharge current for said first paired bit lines, said second current limiting circuit includes a plurality of second current limiting elements disposed between said second bit line precharge potential generation circuit and said second bit line precharge/equalizing circuit and used for limiting the precharge current for said second paired bit lines, at least one of said plurality of first current limiting elements is normally kept in the ON state and the conductances of the remaining first current limiting elements are controlled by a control signal, and at least one of said plurality of second current limiting elements is normally kept in the ON state and the conductances of the remaining second current limiting elements are controlled by a control signal.

16. The semiconductor memory device according to claim 13, wherein each of said first and second current limiting circuits includes a current limiting element which is set in the OFF state in the standby state and set in the ON state in the active state.

17. The semiconductor memory device according to claim 13, wherein each of said first and second current limiting circuits includes a MOS transistor whose conductance is changed by controlling a gate voltage thereof.

18. A screening method of a semiconductor memory device using a shared sense amplifier system, comprising the steps of:

precharging paired bit lines and equalizing the potentials thereof by use of a bit line precharge/equalizing circuit when a precharge operation is specified by an internal activation signal using an external signal as a trigger in a test mode;

setting the bit line precharge/equalizing circuit into an OFF state after the delay of a preset period of time; and detecting variations in the potentials of the paired bit lines.

19. A method for reducing a standby current in a semiconductor memory device using a shared sense amplifier system, comprising the steps of:

supplying a first precharge current to paired bit lines via first and second current limiting elements to effect a precharge/equalizing operation when an active state is attained by an internal activation signal which varies in synchronism with an activation signal from an exterior; and releasing the precharge/equalizing operation before a sense amplifier is activated, turning OFF the second current limiting element and supplying a second precharge current which is smaller than the first precharge current to the paired bit lines via the first current limiting element to effect the precharge/equalizing operation until a next cycle active operation.

20. The method for reducing the standby current according to claim 19, further comprising a step of turning OFF the second current limiting element when a screening operation is specified by a test control signal in a test mode and supplying the second precharge current to the paired bit lines to effect the precharge/equalizing operation.

* * * * *